United States Patent
DePetrillo et al.

(10) Patent No.: US 6,419,779 B1
(45) Date of Patent: Jul. 16, 2002

(54) METHOD FOR SAFE REMOVAL OF DIE FROM CIRCUIT BOARD

(75) Inventors: Kevin DePetrillo; David Bruce Morken, both of San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/520,371

(22) Filed: Mar. 7, 2000

(51) Int. Cl.$^7$ ............................................. B32B 31/00
(52) U.S. Cl. ...................... 156/254; 438/464; 29/426.1; 29/593; 29/763; 269/86; 269/903; 156/64; 83/27; 83/40; 83/50; 83/55
(58) Field of Search ................................ 156/254, 267, 156/64; 438/464; 29/426.1, 593, 762; 269/903, 86; 83/27, 40, 50, 55

(56) References Cited

U.S. PATENT DOCUMENTS 3,969,813 A * 7/1976 Minetti et al. ................ 29/829

* cited by examiner

Primary Examiner—Linda Gray

(57) ABSTRACT

A method for reliable, safe removal of an electrical or electronic component or device mounted on a fragile or brittle circuit board substrate having opposed planar upper and lower surfaces, e.g., for performing testing such as failure analysis, comprises sequential steps of cutting the substrate transversely through its thickness to separate therefrom a segment comprising a first portion including the component or device and a second, adjoining portion; cutting the separated segment longitudinally along a plane parallel to the upper surface, the cutting extending beneath the entirety of the first portion; and cutting the substrate of the separated segment transversely through its thickness to separate the first portion including the component or device from the second portion.

16 Claims, 1 Drawing Sheet

METHOD FOR SAFE REMOVAL OF DIE FROM CIRCUIT BOARD

FIELD OF THE INVENTION

The present invention relates to a method for safe removal of a semiconductor IC chip or die from a circuit board comprised of a brittle material. More particularly, the invention pertains to a method for safely removing, e.g., for performing failure analysis or other type testing, a die or chip comprising a semiconductor integrated circuit device from a brittle circuit board, e.g., comprising a ceramic-based substrate, without causing breakage of the substrate or damage to very fine wires and landing pads on the ceramic substrate utilized for electrically connecting the IC chip or die to the substrate.

BACKGROUND OF THE INVENTION

Electrical and electronic devices typically comprise a plurality of individual components and component devices mounted on at least one surface of a circuit board, e.g., a printed circuit board ("PCB"), and electrically interconnected by means of circuitry located on or beneath the surface(s) of the PCB. The PCB comprises a substrate material, typically in the form of a sheet having opposed planar surfaces on or below which the circuitry is formed and the various components and/or component devices mounted. Typical substrate materials include resins, polymers, polymer composites and laminates, resin-impregnated fiberglass, fiberglass/polymer composites and laminates, ceramics, and glass ceramics, which materials possess varying degrees of fragility and/or brittleness, with ceramic-based materials being most fragile and brittle.

It sometimes becomes necessary, e.g., for quality control, troubleshooting, failure analysis, etc., to perform electrical testing of the individual components and/or component devices, e.g., IC dies or chips, mounted on the PCB. However, accurate testing of the individual components and/or component devices is not always feasible or practicable when the components and/or component devices are electrically interconnected on the PCB substrate because of device interaction (i.e., mutual interference between devices) and the particular circuitry connecting together a plurality of components and/or component devices which can mask or altogether prevent meaningful electrical testing of a particular, e.g., suspect, component or component device. In such instances, it becomes necessary to physically remove the particular component or component device, such as an IC die or chip, from the PCB and any associated mountings, metallic housings, etc., in order to perform meaningful, accurate electrical testing and analysis. Such component removal, however, frequently is problematic in that many of the components and/or component devices are miniaturized and electrically connected to bonding pads on the PCB substrate by a plurality of very narrow diameter, fragile wires which are highly susceptible to breakage during the removal process. The problem of safe component removal, e.g., die or chip removal, is further exacerbated when the PCB substrate itself comprises a fragile and/or brittle material, such as a ceramic-based material. To date, no satisfactory technique exists which reliably provides safe removal of components such as IC dies or chips from PCB substrates comprised of fragile and/or brittle materials, notably ceramic-based substrates.

Accordingly, there exists a need for improved methodology for reliable, safe removal of components and/or component devices, such as IC dies or chips, from fragile and/or brittle PCB substrates, such as ceramic-based substrates, which methodology does not incur damage to the component or component device, the fragile/brittle PCB substrate, and the narrow diameter wire interconnections between the component or component device and the associated bonding/landing pads on the PCB substrate.

The present invention, wherein a series of cutting steps are performed for isolating and separating the portion or segment of a fragile/brittle PCB substrate having mounted thereon the subject component or component device from the balance of the PCB substrate by a process utilizing, e.g., diamond table and wire saws, effectively addresses and solves problems attendant upon the removal of components or component devices from fragile/brittle PCB substrates, while maintaining full compatibility with all aspects of electrical, etc., testing. Further, the means and methodology provided by the present invention enjoy diverse utility in the manufacture of numerous types of electrical and electronic devices.

DISCLOSURE OF THE INVENTION

An advantage of the present invention is an improved method for reliable, safe removal of an electrical or electronic component from a fragile and/or brittle substrate.

Another advantage of the present invention is an improved method for reliable, safe removal of a semiconductor integrated circuit (IC) device in the form of a die or chip from a brittle, ceramic-based circuit board.

Yet another advantage of the present invention is an improved method for electrically testing an electrical or electronic component or component device safely removed from a fragile and/or brittle circuit board.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method for reliable, safe removal of an electrical or electronic component or device from a fragile and/or brittle substrate comprises the sequential steps of:

(a) providing a fragile and/or brittle substrate having an electrical or electronic component or device mounted on a first portion of a planar surface thereof;

(b) cutting the substrate transversely through the thickness thereof to separate therefrom a segment comprising the first portion including the component or device and an adjoining second portion;

(c) cutting the separated segment along a plane parallel to the planar surface, the cutting extending beneath the entirety of the first portion; and (d) cutting the substrate of the separated segment transversely through the thickness thereof to separate the first portion thereof including the component or device from the second portion.

According to a embodiments of the present invention, steps (b) and (d) comprise cutting transversely through the substrate by means of a table saw; and step (c) comprises cutting the substrate longitudinally by means of a wire saw, wherein step (c) further comprises maintaining the separated segment in a fixed position during the longitudinal cutting via a clamping device which grips the second portion thereof adjoining the first portion.

According to further embodiments of the present invention, step (a) comprises providing a substrate with a component comprising a semiconductor integrated circuit (IC) device in the form of a die or chip mounted on the first surface portion thereof, the substrate comprises a circuit board, and the IC device is electrically connected to the first portion of the circuit board substrate on the upper side thereof via a plurality of fine diameter wires extending therefrom to a plurality of bonding pads formed on the first surface portion.

According to yet further embodiments of the present invention, step (a) comprises providing a circuit board substrate comprised of a material selected from the group consisting of resins, polymers, polymer composites, polymer laminates, resin-impregnated fiberglass, fiberglass/polymer composites, fiberglass/polymer laminates, ceramics, and glass/ceramic composites.

According to particular embodiments of the present invention, step (a) comprises providing a ceramic-based circuit board substrate; step (a) further comprises providing the circuit board substrate as a laminate including a metal backing sheet bonded, e.g., adhesively bonded, to the lower side of the circuit board, or step (a) comprises increasing the rigidity of the circuit board substrate prior to performing the cutting steps (b)–(d) by bonding, e.g., adhesive bonding, a metal reinforcing sheet to the lower side thereof.

According to other embodiments of the present invention, steps (b) and (d) each comprise cutting transversely through the circuit board substrate by means of a diamond table saw, and step (c) comprises cutting through the circuit board substrate longitudinally by means of a diamond wire saw, the separated segment of the circuit board substrate being maintained in a fixed position during the longitudinal cutting via a clamping device which grips the second portion of the circuit board substrate adjoining the first portion.

According to still other embodiments of the present invention, step (a) comprises providing the circuit board substrate as a laminate including a metal backing sheet adhesively bonded to the lower side of the circuit board substrate; steps (b) and (d) comprise cutting transversely through the thickness of the laminate; and step (c) comprises cutting the laminate longitudinally along the plane of the adhesive, the separated segment of the circuit board substrate being maintained in a fixed position during the longitudinal cutting via a clamping device which grips the second portion of the circuit board substrate adjoining the first portion.

According to yet other embodiments of the present invention, the method comprises the further step of: (e) electrically testing the IC device on the separated segment.

According to another aspect of the present invention, a method for reliable, safe removal of a die or chip comprising a semiconductor integrated circuit (IC) device from a fragile/brittle circuit board substrate comprises the sequential steps of:

(a) providing a laminate comprising a ceramic-based circuit board substrate having a planar upper surface with an IC die or chip mounted on a first portion thereof and a planar lower surface adhesively bonded to a metal support sheet, the IC device being electrically connected to the upper surface of the ceramic-based circuit board substrate via a plurality of very narrow diameter wires extending therefrom to a plurality of bonding pads formed on the first portion;

(b) cutting the laminate transversely through the thickness thereof to separate therefrom a segment comprising the first portion including the IC device and an adjoining second portion;

(c) cutting the separated segment longitudinally along the plane of the adhesive, parallel to the planar upper surface, the cutting extending beneath the entirety of the first portion; and (d) cutting the laminate of the separated segment transversely through the thickness thereof to separate the first portion including the IC device from the second portion.

According to embodiments of the present invention, steps (b) and (d) each comprise cutting transversely through the thickness of the laminate by means of a diamond table saw; and step (c) comprises cutting the laminate longitudinally along the plane of the adhesive by means of a diamond wire saw, wherein the separated segment is maintained in a fixed position during the longitudinal cutting via a clamping device which grips the second portion of the laminate adjacent the first portion.

According to further embodiments of the present invention, the method comprises the further step (e) of electrically testing the IC device on the separated segment of the laminate.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which like reference numerals are employed throughout to designate similar features, wherein.

DESCRIPTION OF THE INVENTION

The present invention is based upon recognition that a selected electrical or electronic component or device mounted on a fragile and/or brittle circuit board substrate, such as of ceramic material, can be reliably and safely removed, i.e., separated, from the circuit board for testing, inspection, troubleshooting, etc., without incurring damage to its electrical leads and connections to the circuit board, by means of a multi-step cutting procedure involving first making several transverse cuts through the thickness of the substrate for forming a segment of the circuit board substrate comprising the selected component or device and then making a longitudinal cut extending beneath the substrate surface for separating the substrate from any backing or reinforcing sheet. The first, transverse cutting steps for segmenting of the original circuit board substrate are performed in a manner as to provide sufficient additional substrate for maintaining the segment in a fixed position during the longitudinal cutting by gripping the additional substrate segment in a suitable clamping means.

A key feature of the method according to the present invention is the use of diamond table and wire saws for respectively performing the transverse and longitudinal cutting steps in a minimum time and with little damage to the substrate, electronic component or device, and its associated wiring.

Figure 1:
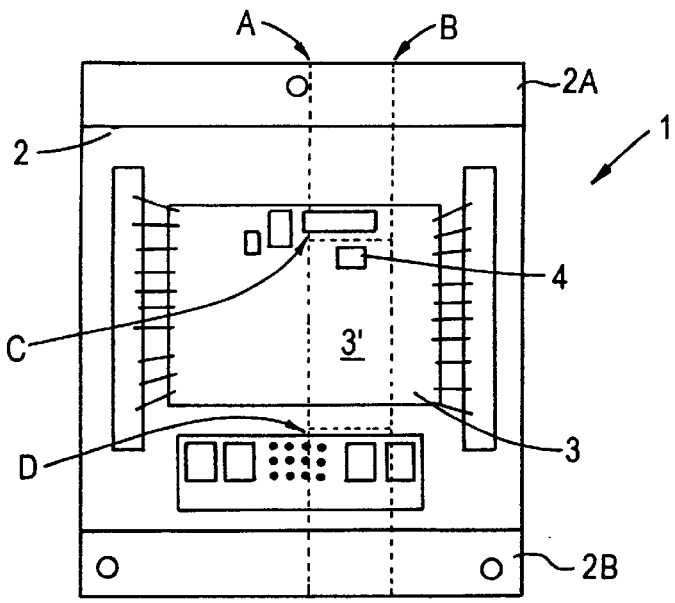
FIG. 1 schematically illustrates, in plan view, an electronic device module comprising a semiconductor IC device in the form of a die or chip mounted on a fragile/brittle ceramic-based circuit board substrate.
Figure 2:
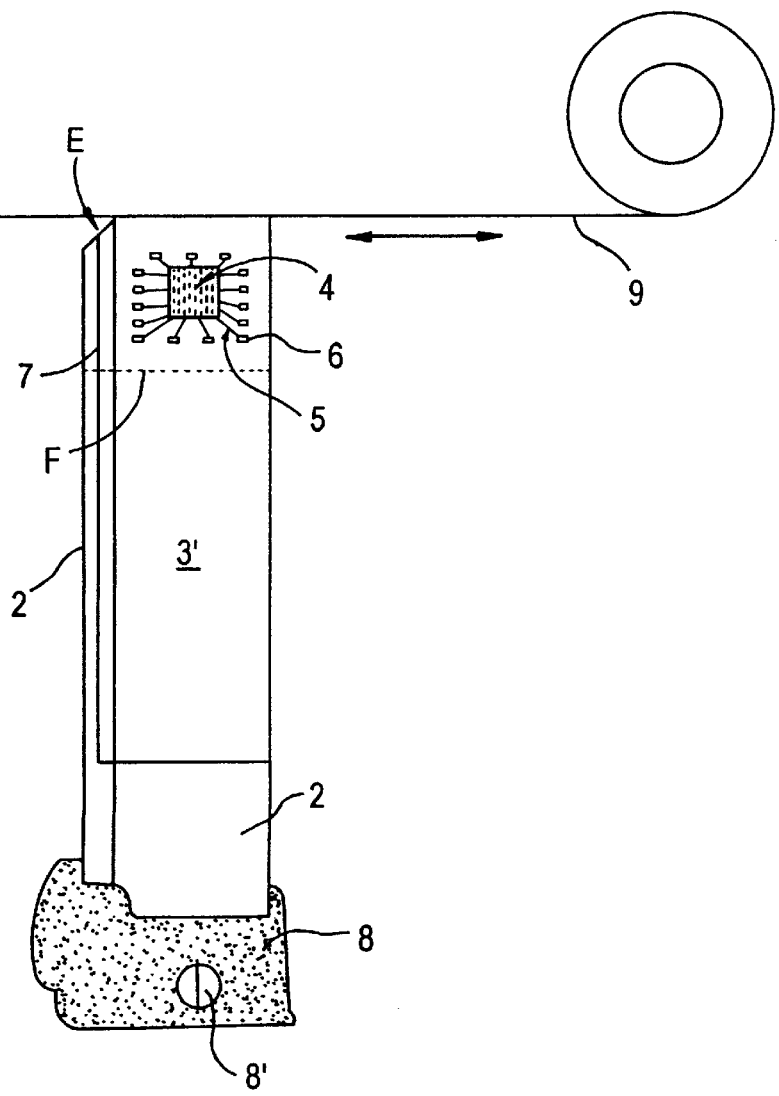
FIG. 2 schematically illustrates, in perspective view, cutting of a segment of the ceramic-based circuit board substrate to provide a smaller segment comprising the IC device die or chip suitable for electrical testing.

Referring now to FIG. 1, shown therein, in schematic plan view, is a portion of an electronic module 1, illustratively an automobile anti-lock braking system module, which has been partially disassembled in order to facilitate removal of a suspect IC die or chip therefrom for failure analysis testing. As illustrated, module 1 comprises a metal housing 2 including perforated mounting flanges 2A, 2B at opposite ends thereof A thin, i.e., about 0.7 mm thick, ceramic-based circuit board substrate 3 having planar upper (shown) and lower surfaces is at least partially in-laid in a correspondingly dimensioned recess formed in a central portion of metal housing 2 and adhesively bonded thereto by means of adhesive 7 (see FIG. 2). the circuit board substrate 3 mounts thereon a plurality of electrical and electronic components or devices, including, inter alia, suspect IC die or chip 4. As best seen in FIG. 2, IC die or chip 4 is electrically connected to the circuit board substrate 3 via a plurality of very fine diameter wires 5, typically of silver (Ag) or gold (Au), attached or otherwise connected to a corresponding plurality of bonding pads 6, typically of Ag or Au, formed on the upper surface of the circuit board substrate. The physical and electrical integrity of the wire-to-bonding pad attachment or connection must be maintained during the segmentation/separation process for removing/separating IC die or chip 4 from the circuit board substrate 3 in order to facilitate electrical testing thereof. Additional features, components, etc., of module 1 shown in the figure but not germane to the present invention are not described herein in order not to unnecessarily obscure the invention.

According to the invention, in a first step, a series of transverse cuts indicated by the dotted lines shown in FIG. 1 and respectively identified by reference letters A, B, C, and D and extending through the thickness of the circuit board substrate 3 and underlying metal housing 2 are made, in any desired order, as by means of a diamond-bladed table saw (e.g., "Trim Saw", available from Allied High Tech Products, Rancho Dominguez, Calif.), in order to separate from the relatively large area circuit board substrate 3 a smaller segment 3' comprised of a relatively smaller, first, or upper portion including suspect IC die or chip 4 and a relatively larger, second, or lower portion including an exposed part of metal housing 2 at its lower end.

In a second step according to the inventive methodology, the thus-formed smaller segment 3' including suspect IC die or chip 4 is fixedly gripped, via its lower end including the exposed part of metal housing 2, in clamping fixture 8 comprising at least one set screw 8', for maintaining a constant position during longitudinal cutting of the laminated substrate 3/2 along the plane E of adhesive layer 7 utilized for bonding ceramic-based circuit board substrate 3 to underlying metal housing 2. Longitudinal cutting along adhesive 7 may be accomplished, for example by means of a diamond wire saw 9 (e.g., "Guillotine Diamond Wire Saw", available from Laser Technology West, Ltd., Colorado Springs, Colo.) having a wire blade oscillating in the directions indicated by the arrows shown in the figure while a downward force is applied thereto. The longitudinal cutting proceeds until the laminate is separated into its component layers to just beyond IC die or chip 4.

In the next step according to the invention, a final transverse cut F is made just below the lower edge of the IC die or chip 4 and associated wires/bonding pads 5/6 by means of the diamond-bladed table saw to extend through at least the ceramic-based circuit board substrate 3', thereby providing, in a reliable and safe manner, a separated IC die or chip 4 with all connections/attachments between wire leads 5 and bonding pads 6 intact. According to the inventive methodology, the IC die or chip 4 is removed from any underlying metallic reinforcement or housing component which could interfere with electrical testing in a subsequent step. If necessary or desirable, the removed IC die or chip 4 may be remounted or installed in an appropriate fixture for facilitating the electrical testing and analysis.

While in the illustrated embodiment utilizing anti-lock brake module 1 the fragile/brittle ceramic-based circuit board substrate is adhered to the underlying rigid metal housing 2 and thus mechanically reinforced during the removal process so as to prevent potentially harmful flexing of the PCB substrate, in instances where the fragile circuit board substrate, whether comprised of a ceramic-based material or any of the other previously enumerated materials, is not mechanically reinforced by means of such rigid backing, a metal or other suitably rigid backing or reinforcing sheet may be adhesively bonded or otherwise affixed to the lower (rear) surface of the circuit board substrate prior to performing the various cutting steps for providing resistance to substrate flexing and thus decreased likelihood of fracture, as well as facilitating gripping by the clamping fixture.

A number of advantages are thus provided by the inventive methodology, including, inter alia, simplicity, ease of performance, and increased reliability with substantially decreased occurrence of breakage/damage of the IC die and associated wiring and bonding pads. Further, the inventive methodology is not limited to use with IC dies or chips but rather is applicable to performing reliable, safe removal of all manner of electrical and electronic components and devices for testing, evaluation, troubleshooting, etc.

In the previous description, numerous specific details have been set forth, such as specific materials, structures, processes, etc. in order to provide a better understanding of the present invention. However, the present invention can be practiced without resorting to the details specifically set forth. In other instances, well-known processing techniques and structures have not been described in detail in order not to unnecessarily obscure the present invention.

Only the preferred embodiments of the present invention and but a few examples of its versatility are shown and described in the present invention. It is to be understood that the present invention is capable of use in various other combinations and environments and is susceptible of changes and/or modifications within the scope of the inventive concept as expressed herein.

What is claimed is:

1. A method for reliable, safe removal of an electrical component form a fragile and/or brittle substrate, comprising the sequential steps of:
    (a) providing a fragile and/or brittle substrate having an electrical component mounted on a first portion of a planar surface thereof;
    (b) cutting said substrate transversely through the thickness thereof to separate therefrom a segment comprising said first said portion including said component and an adjoining second portion;
    (c) cutting the separated segment longitudinally along a plane parallel to said planar surface, said cutting extending beneath the entirety of said first portion; and (d) cutting the substrate of the separated segment transversely through the thickness thereof to separate said first portion including said component from said second portion.

2. The method as in claim 1, wherein:

steps (b) and (d) comprise cutting transversely through said substrate by means of a table saw; and step (c) comprises cutting said substrate longitudinally by means of a wire saw.

3. The method as in claim 2, wherein:

step (c) further comprises maintaining said separated segment in a fixed position during said longitudinal cutting via a clamping device which grips said second portion thereof adjoining said first portion.

4. The method of claim 1, wherein:

step (a) comprises providing a substrate with a component comprising a semiconductor integrated circuit (IC) in the form of a die or chip mounted on said first surface portion thereof, said substrate comprises a circuit board, and said IC is electrically connected to said first portion of said circuit board on the upper surface thereof via a plurality of very narrow diameter wires extending therefrom to a plurality of bonding pads formed on said first portion.

5. The method as in claim 4, wherein:

step (a) comprises providing a circuit board substrate comprising a material selected from the group consisting of resin including polymers, polymer composites, polymer laminates, resin-impregnated fiberglass, fiberglass/polymer composites, fiberglass/polymer laminates, ceramics, and glass/ceramic composites.

6. The method as in claim 4, wherein:

step (a) comprises providing a ceramic-based circuit board substrate.

7. The method as in claim 4, wherein:

step (a) comprises providing said circuit board substrate as a laminate including a metal backing sheet bonded to the lower side of said circuit board.

8. The method as in claim 7, wherein:

step (a) comprises providing an adhesively bonded laminate.

9. The method as in claim 4, wherein:

step (a) further comprises increasing the rigidity of said circuit board substrate prior to said performing said cutting steps (b)–(d) by bonding a metal reinforcing sheet to the lower side thereof.

10. The method as in claim 9, wherein:

step (a) comprises adhesively bonding said metal reinforcing sheet to said lower side of said circuit board substrate.

11. The method as in claim 4, wherein:

steps (b) and (d) each comprise cutting transversely through the thickness said circuit board substrate by means of a diamond table saw; and step (c) comprises cutting said circuit board substrate longitudinally by means of a diamond wire saw.

12. The method as in claim 11, wherein:

step (c) further comprises maintaining said separated segment in a fixed position during said longitudinal cutting via a clamping device which grips said second portion of said circuit board substrate adjoining said first portion.

13. The method as in claim 11, wherein:

step (a) comprises providing said circuit board substrate as a laminate including a metal backing sheet adhesively bonded to the lower side of said circuit board substrate;

steps (b) and (d) comprise cutting transversely through the thickness of said laminate; and step (c) comprises cutting said laminate longitudinally along the plane of the adhesive.

14. The method as in claim 13, wherein:

step (c) further includes maintaining said separated segment in a fixed position during said longitudinal cutting via a clamping device which grips said second portion of said laminate adjoining said first portion.

15. The method as in claim 11, comprising the further step of:

(e) electrically testing the IC device after removal.

16. The method according to claim 1, wherein the substrate comprises a planar lower surface adhesively bonded to a metal support sheet.

* * * * *